US007766670B1

(12) United States Patent
Ju (10) Patent No.: US 7,766,670 B1
(45) Date of Patent: Aug. 3, 2010

(54) ELECTRICAL CONNECTION DEVICE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/471,696

(22) Filed: May 26, 2009

(51) Int. Cl.
*H01R 12/00* (2006.01)

(52) U.S. Cl. .......................................... 439/70; 439/83
(58) Field of Classification Search ............... 439/70, 439/342, 83, 71
See application file for complete search history.

(56) References Cited

U.S. PATENT DOCUMENTS

| 6,425,785 | B1 | 7/2002 | Azuma |  |
|---|---|---|---|---|
| 7,086,903 | B2 * | 8/2006 | Takada | 439/628 |
| 7,097,465 | B1 * | 8/2006 | Korsunsky et al. | 439/74 |
| 7,121,860 | B2 * | 10/2006 | Cram et al. | 439/266 |
| 7,351,071 | B2 * | 4/2008 | Korsunsky et al. | 439/74 |
| 2005/0239301 | A1 * | 10/2005 | Morana et al. | 439/70 |

* cited by examiner

*Primary Examiner*—Hien Vu
(74) *Attorney, Agent, or Firm*—Kile Goekjian Reed & McManus PLLC (57) ABSTRACT

An electrical connection device is used for electrically connecting an electronic element having solder balls, and includes an insulating body and a plurality of pins. The insulating body has a plurality of receiving slots formed by a plurality of first rib boards and second rib boards respectively and crossly disposed along the X and Y-coordinate direction. Each pin has a base portion extending upwardly to form a first and a second flexible arm. The end of the first and the second flexible arm respectively form a first contact portion and a second contact portion. At least one of the receiving slots receives the first flexible arm of the pin and the second flexible arm of another pin. The first and the second contact portion located in the same receiving slot are disposed staggered in an upper and a lower location along the X-coordinate direction and not connected to each other.

7 Claims, 6 Drawing Sheets

ELECTRICAL CONNECTION DEVICE

BACKGROUND OF THE INVENTION

1. Field of the Invention

The present invention relates to an electrical connection device, in particular, relates to an electrical connection device with high density.

2. Description of Related Art

U.S. Pat. No. 6,425,785 discloses an electrical connection device that includes an insulating body and a plurality of pins. There is a plurality of receiving slots corresponding to the pins on the insulating body. Two opposite inner walls of the receiving slots respectively have a first convex stage and a second convex stage. Two convex stages are adjacently disposed at an upper location and a lower location along the extending direction of the receiving slots. The second convex stage is located above the first convex stage. The vertical distance between the two convex stages is equal to the thickness of the pin for wedging the pin.

Each of the pin has a base portion. The center of the base portion has a convex portion. The height of the convex portion is equal to the vertical distance between the front end of the first convex stage and the inner wall. The base portion extends upwardly to form two bent flake-shaped flexible arms. The end of the flexible arm forms a contact portion. Two contact portions are symmetrically disposed. The base portion extends downwards to form a welding portion.

When the pins are received in the receiving slots, each of the pins respectively corresponds to one receiving slot and the convex portion on the base portion faces the first convex stage. When the convex portion leans against the inner wall of the first convex stage and is adjacent to the first convex stage, the pin is fastened. At this time, the welding portion is located below the first convex stage and is welded with a solder ball. Each of the contact portions of the pin is higher than the slot opening of the receiving slot for contacting a plugging part of an electronic connecting element. Part of the two contact portions of the pins is overlapped in the side-view diagram.

When the plugging part is plugged into the two contact portions, the two contact portions are pushed by the plugging part and respectively move in opposite directions. The two contact portions respectively press onto the diagonal locations of the opposite surfaces of the plugging part.

The drawbacks of the electrical connection device are:

1. When the pin is received in the receiving slot, the pin is fastened on the main body by utilizing the interference of the convex stage on the inner wall and the convex portion on the base portion. By using this fastening way, there is no other interference structure above the pin. The pin may easily escape from the receiving slot. Furthermore, by having a convex stage on the inner wall of the receiving slot, the required space of the receiving slot increases.

2. Each pin corresponds to one receiving slot. When the pin is pressed and pushed by the plugging part to respectively move in opposite directions, so that the required space for the receiving slot is thus the total space required for the deformation of two contact portions. Therefore the dimension of the receiving slot cannot be reduced.

Figure 1:
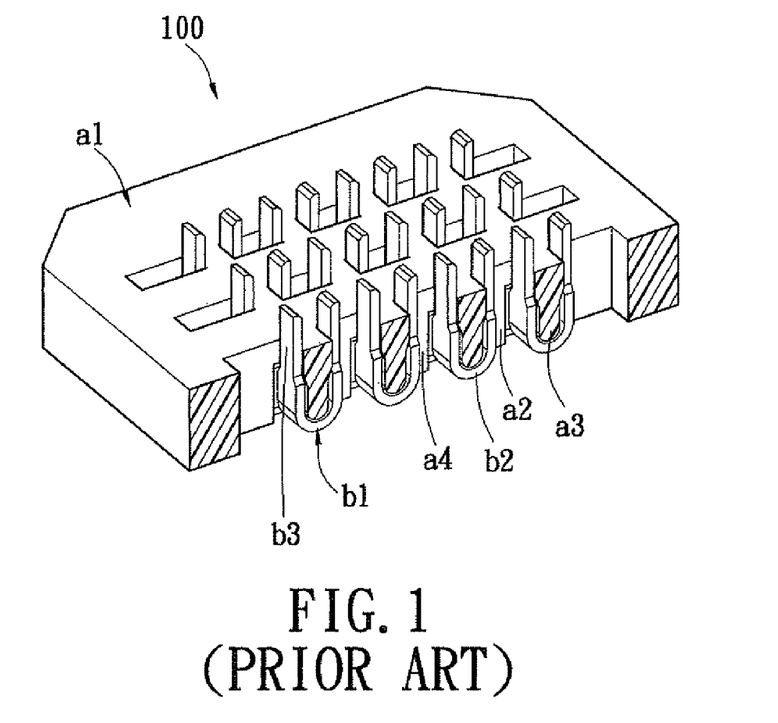
FIG. 1 is a partial cross-sectional view of an electrical connection device of the prior art.
Figure 2:
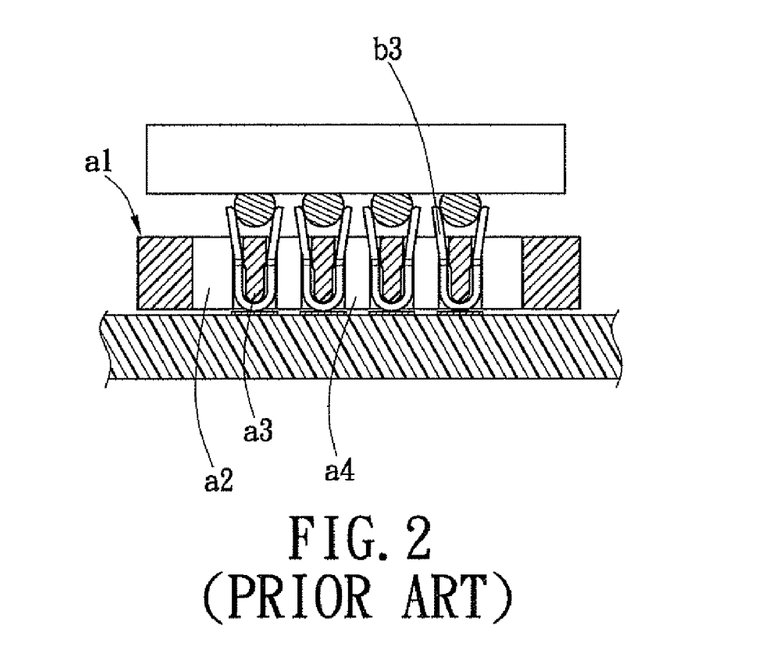
FIG. 2 is a cross-sectional view of the electrical connection device in FIG. 1 electrically connecting a chip module to a circuit board.

In order to resolve the above problems, the present inventor designed an improved electrical connection device. An electrical connection device contacting an electronic element which has solder balls (as shown in FIGS. 1 and 2). The electrical connection device 100 includes a main body (a1) and a plurality of pins (b1). The main body (a1) has at least one trough (a2). At least two rib boards (a3) are disposed at the trough (a2). In the trough (a2), there is a receiving space (a4) between two rib boards (a3). The pins (b1) are respectively located in the trough (a2), and part of at least two pins (b1) are received in the same receiving space (a4).

The pin (b1) has a base portion (b2) and is located below one of the rib boards (a3). Both sides of the base portion (b2) that correspond to the rib board (a3) extend upwardly to form a pair of contact portions (b3). The pair of contact portions (b3) are respectively clamped at both side of the rib board (a3), and at least one contact portion (b3) passes through the receiving space (a4). When the pair of contact portions (b3) of each of the pin (b1) contacts with the electronic element, the pair of contact portions (b3) respectively move forwards in a direction that is far away from the rib board (a3). Because the base portion (b2) is located below the rib board (a3), the pin (b1) will not escape from the main body (a1). Moreover, because the contact portions (b3) of the pin (b1) are clamped at both sides of the rib board (a3), the pin (b1) does not escape from the main body (a1). One receiving space (a4) receives part of two of the pins (b1). When the contact portions (b3) of two adjacent pins (b1) contact with the electronic element, the contact portions (b3) respectively depart from the clamped rib board (a3). Therefore, the contact portions (b3) of different pins (b1) in the same receiving space (a4) are adjacent to each other. In order to prevent the pins (b1) from unintentional electrical contact and from interfering with each other, the receiving space (a4) has to be adequate for receiving the pins (b1) and so that the pins (b1) will not contact with each other.

The above electrical connection device still has the following drawbacks. Because the receiving space (a4) has to be adequate for assuring the pins (b1) received in the receiving space (a4) in order not to electrically contact with each other, the main body (a1) with the same or comparative dimension cannot form more receiving spaces (a4). This means that the main body (a1) with the same or comparative dimension cannot receive more quantities of the pins (b1), therefore the density of the pins is limited.

Thus there is a need to invent a new electrical connection device for overcoming the above shortcomings.

SUMMARY OF THE INVENTION

One particular object of the present invention is to provide an electrical connection device that have pins disposed with high density, and the contact portion of each pin is a flexible and movable structure. When the pins are pressed and the contact portions move forward in the side direction, the pins will not electrically contact with each other.

The electrical connection device is used for electrically connecting an electronic element with solder balls, and includes an insulating body and a plurality of pins. The insulating body has a plurality of receiving slots that are formed by a plurality of first rib boards and a plurality of second rib boards respectively and crossly disposed continuously along the X-coordinate direction and the Y-coordinate direction. Each of the pins has a base portion located below the first rib board. A first flexible arm and a second flexible arm are extended upwardly from the base portion respectively. The end of the first flexible arm and the end of the second flexible arm respectively form a first contact portion and a second contact portion, the first contact portion and the second contact portion are slanted and opposite to each other. The first contact portion and the second contact portion are respectively pressed by one of two opposite sides of the solder ball. The first contact portion and the second contact portion of each of the pins respectively enter into the receiving slots that are adjacent. Thereby, each of the receiving slots receives the first flexible arm of one of the pins and the second flexible arm of another one of the pins. The first contact portion and the second contact portion in the receiving slot are disposed along X-coordinate direction and cross each other respectively in an upper location and a lower location. When the solder ball has pressed to contact with the first contact portion and the second contact portion of one of the pins, the first contact portion and the second contact portion respectively departs from the center of the solder ball along the X-coordinate direction.

The electrical connection device is used for electrically connecting an electronic element with solder balls, and includes an insulating body, a plurality of pins, and a circuit board. The insulating body has a plurality of receiving slots that are formed by a plurality of first rib boards and a plurality of second rib boards respectively and crossly disposed continuously along the X-coordinate direction and the Y-coordinate direction. Each of the pins has a base portion located below the first rib board, and the bottom of the base portion forms a soldering portion. Two opposite sides of the base portion respectively extends upwardly along both sides of the first rib board to form a first flexible arm and a second flexible arm. The end of the first flexible arm and the end of the second flexible arm respectively form a first contact portion and a second contact portion that are opposite to each other and slanted. The first contact portion and the second contact portion are respectively pressed by the two opposite sides of the solder ball. The first contact portion and the second contact portion of each pin respectively enter into different receiving slots. Thereby each of the receiving slots receives the first flexible arm of one of the pins and the second flexible arm of another one of the pins. The first contact portion and the second contact portion in the receiving slot are disposed along X-coordinate direction and cross each other respectively in an upper location and a lower location. When the solder ball is pressed to contact with the first contact portion and the second contact portion of the pins, the first contact portion and the second contact portion respectively departs from the X-coordinate direction and the Y-coordinate direction extending from the center of the solder ball. The circuit board has a plurality of soldering pads that are respectively soldered with the soldering portion.

For the electrical connection device of the present invention, the first flexible arm and the second flexible arm of each of the pins respectively enter into the receiving slots that are adjacent, thereby each of the receiving slots respectively receives the first flexible arm of one of the pins and the second flexible arm of another one of the pins, and the first contact portion and the second contact portion in the receiving slot are disposed along X-coordinate direction and cross each other respectively in an upper location and a lower location. The first contact portion and the second contact portion are thus crossly disposed. When the first contact portion and the second contact portion of the two different pins that are located in the same receiving slot contact the electronic element, the first contact portion and the second contact portion is close to each other along the X-coordinate direction and has a gap along the Y-coordinate direction. Therefore, when the pin is pressed, two different pins in the same receiving slot will not interfere with each other. This means that the pins would not electrically connect with each other. When the pin is deformed and moved, the required moving space of the two contact portions in the receiving slot is equal to the required moving space of one contact portion of one pin. Thereby, the dimension of the receiving slot can be reduced. Therefore, the insulating body with the same dimension can form more receiving slots and receive more pins. The high density effect is thus achieved.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 3:
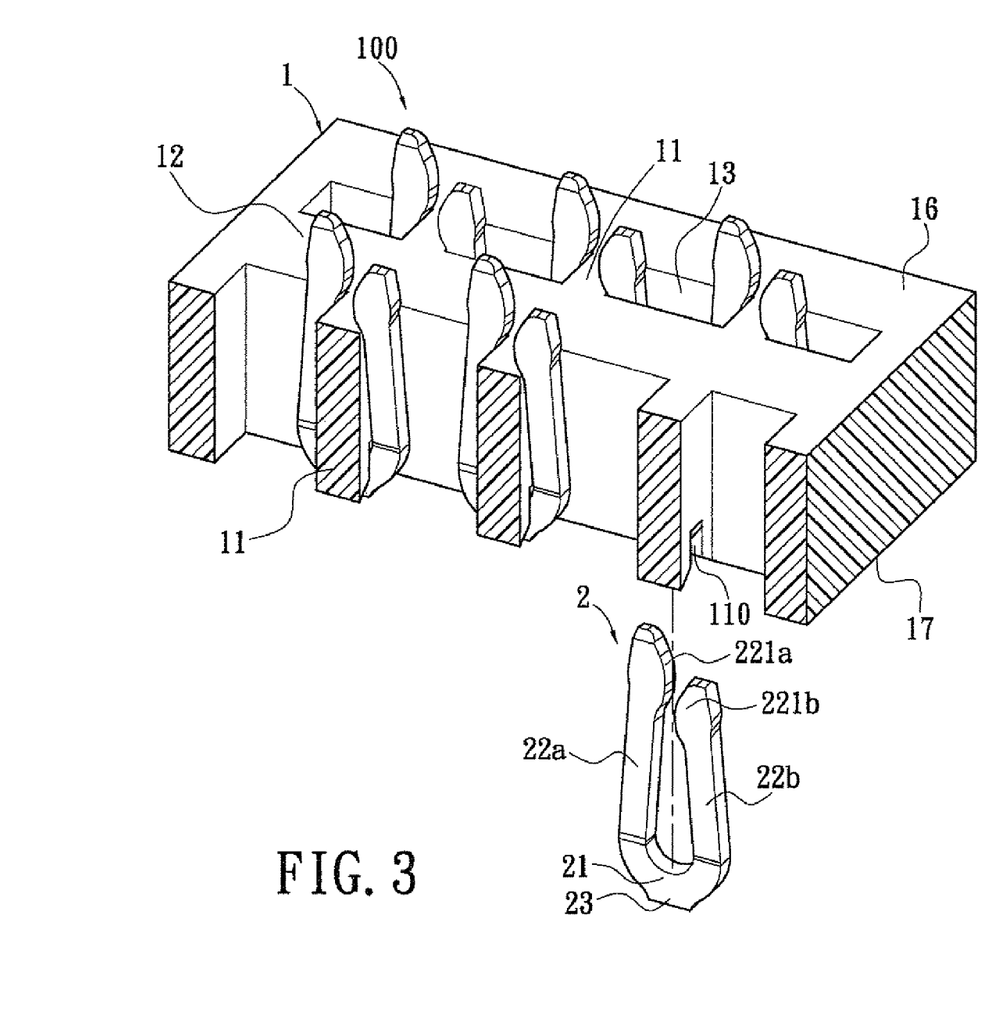
FIG. 3 is a partial cross-sectional view of an electrical connection device of the present invention.

Referring to FIG. 3, a partial cross-sectional view of an electrical connection device of the present invention is shown. The electrical connection device 100 includes an insulating body 1 and a plurality of pins 2.

Figure 4:
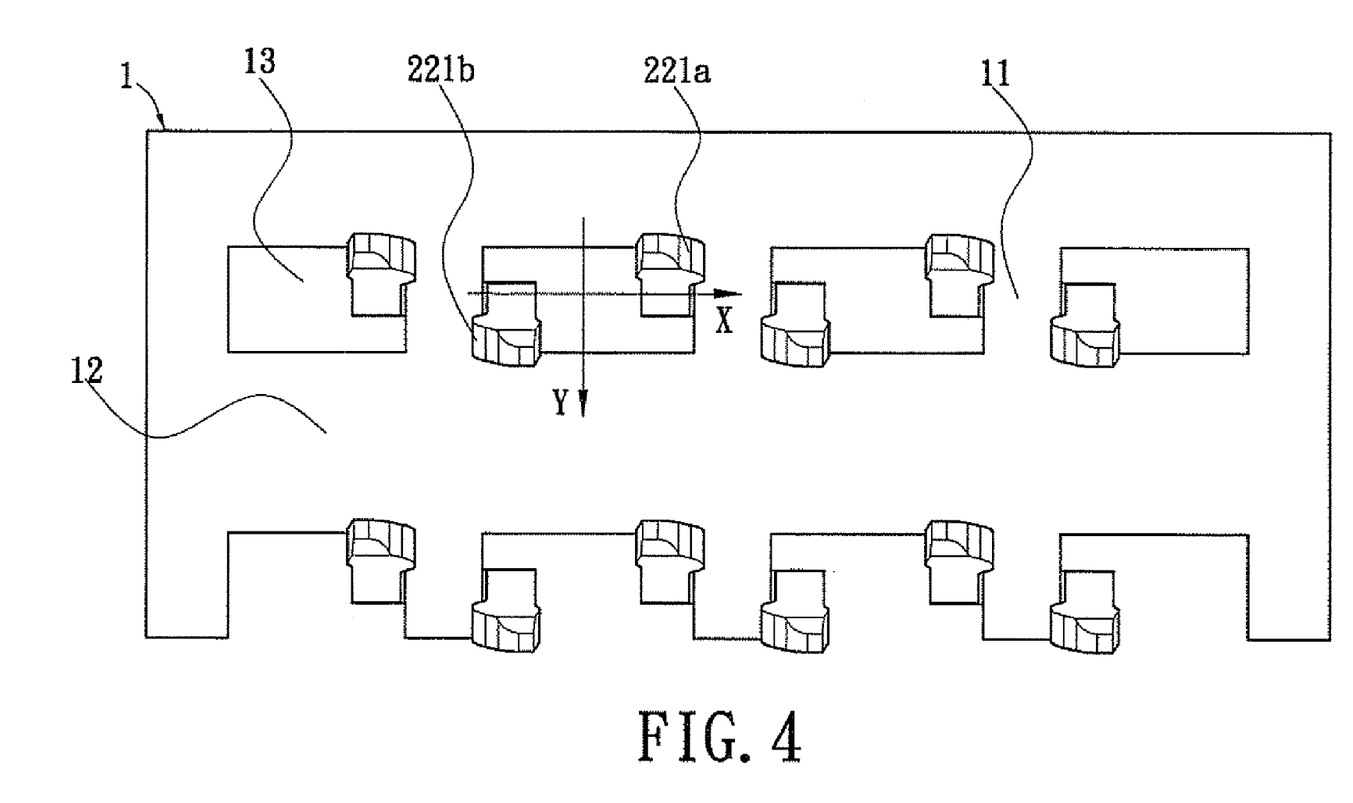
FIG. 4 is a partial top view of the electrical connection device in FIG. 3.

The insulating body 1 has a plurality of receiving slots arranged along a plurality of parallel columns and a plurality of parallel rows. The columns are perpendicular to the plurality of parallel rows. Thus, a plurality of first rib boards 11 are formed between adjacent receiving slots along each of the plurality of parallel rows, and a plurality of second rib boards 12 are formed between adjacent slots along each of the parallel columns. The columns define a Y-coordinate direction and the rows define a X-coordinate direction, as shown in FIG. 4. The insulating body 1 has an upper surface 16 and a lower surface 17. The first rib board 11 between two adjacent receiving slots 13 close to the end of the lower surface 17 of the insulating body 1 has an opening 110. The insulating body 1 has a plurality of positioning posts 14 (referring to FIG. 6).

Each of the pins 2 has a base portion 21. A first flexible arm 22a and a second flexible arm 22b are extended upwardly from both sides of the base portion 21 respectively until an end of the first flexible arm 22a and an end of the second flexible arm 22b are above the upper surface 16 of the insulating body 1. The end of the first flexible arm 22a and the end of the second flexible arm 22b respectively form a first contact portion 221a and a second contact portion 221b. The first flexible arm 22a and the second flexible arm 22b are slanted in opposite direction along the Y-coordinate direction, and thus the first contact portion 221a and the second contact portion 221b are misaligned with each other along the X-coordinate direction. The bottom of the base portion 21 extends downwards to form an electric conducting portion 23.

Referring to FIG. 3, while assembling, each of the pins 2 respectively corresponds to the first rib board 11 between the two adjacent receiving slots 13. The pin 2 is plugged downwards into the receiving slot 13 via the lower surface 17 of the insulating body 1 until the base portion 21 contacts the lower side of the first rib board 11 and is received in the opening 110. The base portion 21 and the opening 110 can be tightly fastened along the Y-coordinate direction to prevent the pin 2 from moving along the Y-coordinate direction. The first contact portion 221a and the second contact portion 221b are respectively higher than the first rib board 11 and the second rib board 12.

After assembled, the first flexible arm 22a and the second flexible arm 22b of the pin 2 are respectively located at both sides of the first rib board 11, and the first contact portion 221a and the second contact portion 221b are respectively received in two adjacent receiving slots 13. The receiving slot 13 respectively receives the first flexible arm 22a and the second flexible arm 22b of different pins 2. In other words, the receiving slot 13 respectively receives the first flexible arm 22a of one of the pins 2 and the second flexible arm 22b of another one of the pins 2; and the first contact portion 221a and the second contact portion 221b in the receiving slot 13 are disposed along X-coordinate direction and cross each other respectively in an upper location and a lower location. Referring to FIG. 4. The aforementioned relation of being disposed and cross each other respectively in an upper location is told from a top view perspective of electrical connection device 100. Each receiving slot 13 is treated as one block. Each block is passed by the X-coordinate and the Y-coordinate. The X-coordinate and the Y-coordinate divides the receiving slot 13 into a first area, a second area, a third area, and a fourth area. From the top view, the first contact portion 221a and the second contact portion 221b can be treated as two points. The first contact portion 221a and the second contact portion 221b are respectively located at the first area and the third area, or the second area and the fourth area. At this time, the first contact portion 221a and the second contact portion 221b respectively are located at the upper side and the lower side of the X-coordinate, and are crossly disposed. This means that the X-coordinate values of the normal line passing through the two points are different. Even though the first contact portion 221a approaches the second contact portion 221b, the first contact portion 221a and the second contact portion 221b are merely close to each other along the X-coordinate. There is still a gap between the first contact portion 221a and the second contact portion 221b along the Y-coordinate.

Figure 5:
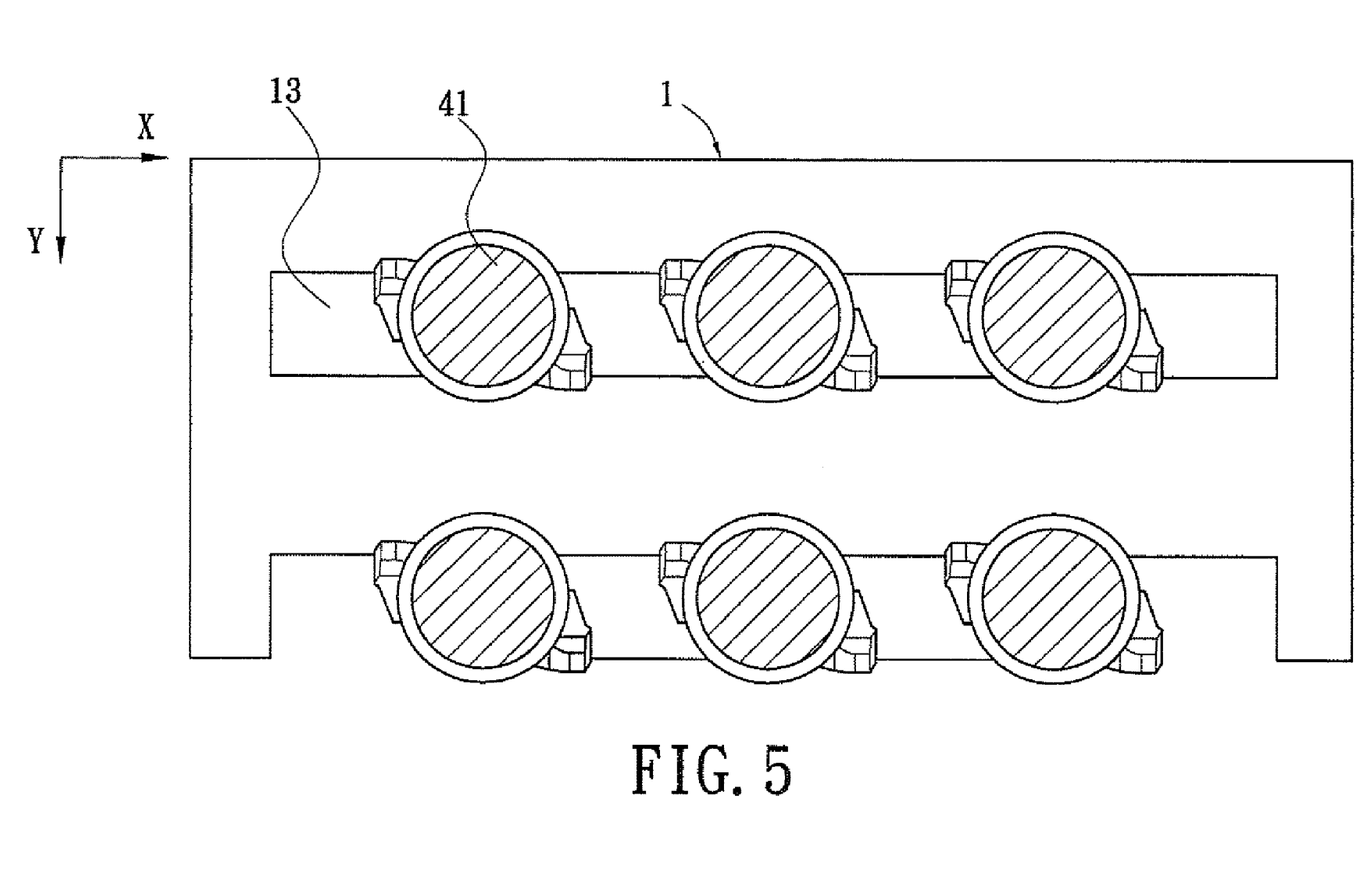
FIG. 5 a partial cross-sectional view of the electrical connection device in FIG. 3 being pressed by an electronic element.

Referring to FIGS. 3, 4, and 5. Part of the receiving slots 13 merely receives one first flexible arm 22a or one second flexible arm 22b of one pin 2. The above receiving slots 13 are two rows of receiving slots 13 that are closest to the first rib board 11 located at the both sides of the insulating body 1 and are parallel to the first rib board 11. Because the two rows of receiving slots 13 are located at the both side walls of the insulating body 1, therefore the receiving slots 13 at the furthest end (located at the two side walls) can only receive either one first flexible arm 22a or one second flexible arms 22b of one pin 2, and cannot have another pin 2 plugged therein.

Figure 6:
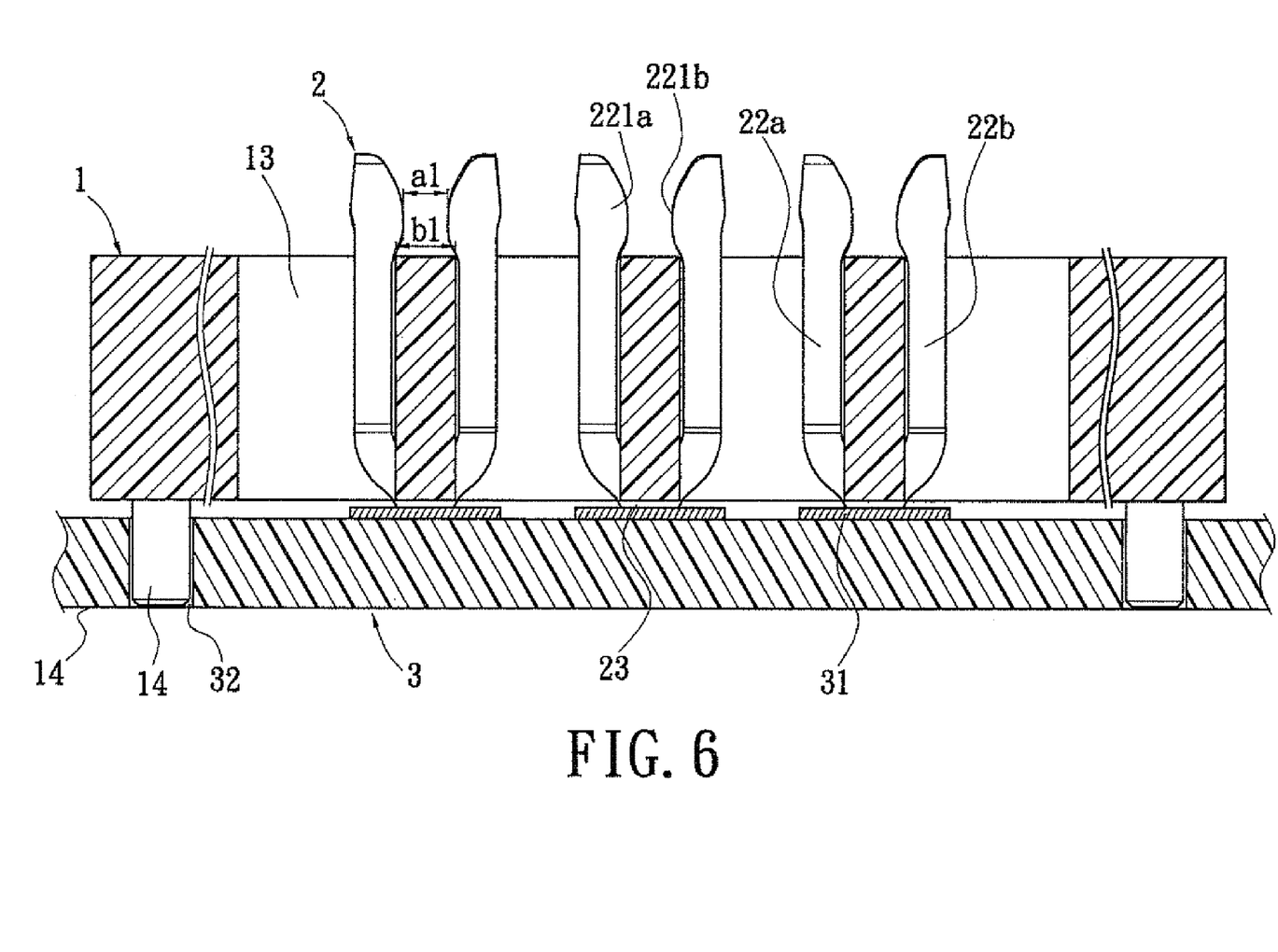
FIG. 6 is a partial cross-sectional view of the electrical connection device in FIG. 3 being electrically connected with the circuit board.

Referring to FIG. 6. At least part of the gap a1 between the first contact portion 221a and the second contact portion 221b of the same pin 2 is narrower than the width b1 of the first rib board 11. The width b1 is the widest width of the rib board 11. Therefore, when the pin 2 is installed into the receiving slot 13, it can prevent the pin 2 escaping from the receiving slot 13.

Figure 7:
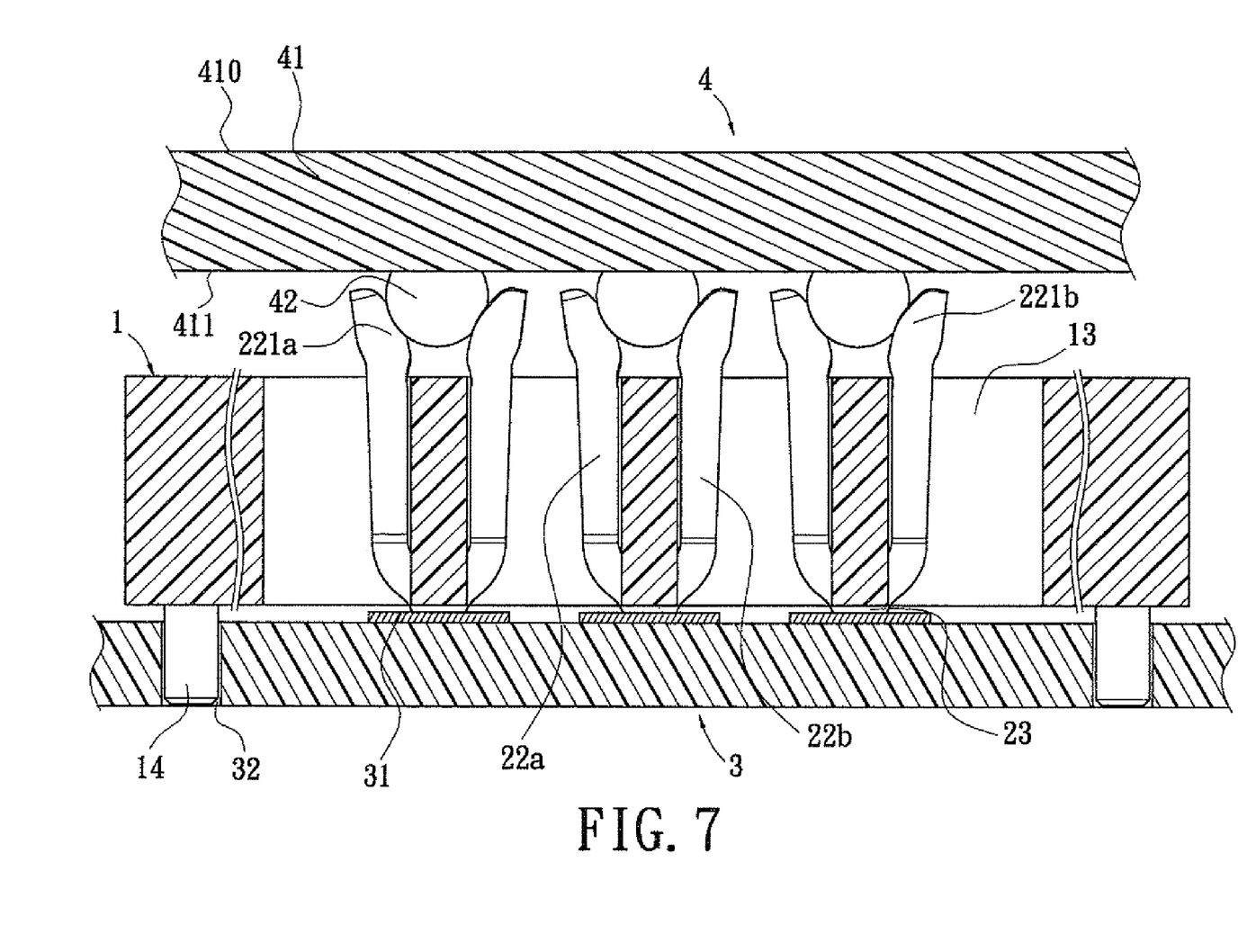
FIG. 7 is a partial cross-sectional view of the electrical connection device in FIG. 3 electrically connecting the electronic element to the circuit board.

Referring to FIGS. 5, 6, and 7. The electrical connection device 100 is used for electrically connecting an electronic element with solder balls 42 to a circuit board 3.

The electronic element is a chip module 4 or other electronic element with solder balls 42. In this embodiment, the electronic element is a chip module 4. The chip module 4 includes a carry board 41. The carry board 41 has a top surface 410 and a bottom surface 411 opposite to the top surface 410. A chip unit (not shown) is located at the top surface 410, and a plurality of solder balls 42 is located at the bottom surface 411. Each solder ball 42 respectively corresponds to one of the pins 2.

The electrical connection device 100 was assembled to one surface of the circuit board 3. The surface provides a plurality of conducting area 31 corresponding to the pins 2.

There are two conditions for assembling the electrical connection device 100 to the circuit board 3.

For the first condition, each of the electric conducting portions 23 are directly pressed and connected with the conducting area 31. Because the insulating body 1 has the positioning posts 14 and the circuit board 3 has positioning holes 32, corresponding to the positioning posts 14, so that the electrical connection device 100 can be exactly located onto the circuit board 3. The positioning posts 14 tightly match the positioning holes 32 so that the electrical connection device 100 is positioned and fastened. At this time, the electric conducting portions 23 also correspond to the conducting area 31 and the electric conducting portions 23 tightly contact the conducting area 31 so that both are electrically conducted. It does not need soldering material to achieve the electrical conduction. The manufacturing process is simplified and the required material is reduced.

For the second condition, the electric conducting portion 23 is a soldering part, and the conducting area 31 is a soldering pad area. When the electrical connection device 100 is located on the circuit board 3, the soldering part of the pin 2 corresponds to the soldering pad area on the circuit board 3, and the electrical connection device 100 is fastened on the circuit board 3 via soldering material.

After the electrical connection device 100 is installed on the circuit board 3, the chip module 4 is installed on the electrical connection device 100.

Firstly, each of the solder balls 42 of the chip module 4 corresponds to each of the pins 2 of the electrical connection device 100. Next, the chip module 4 is pressed downwards so that the solder balls 42 tightly contact the pins 2. The projection shadow of at least one solder ball 42 is located above the first rib board 11 and the two receiving slots 13 that are adjacent to both sides of the first rib board 11.

When the chip module 4 is pressed to contact the electrical connection device 100, the opposite sides of the solder ball 42 can be pressed and contacted by the first contact portion 221a and the second contact portion 221b of the same pin 2. The first contact portion 221a and the second contact portion 221b respectively depart from the center of the solder ball 42 along the X-coordinate direction and the Y-coordinate direction. Part of the solder ball 42 that is pressed leans against the first contact portion 221a and the second contact portion 221b which are slanted. The force produced by the solder ball 42 to the pin 2 makes the electric conducting portion 23 being tightly contacted against the conducting area 31 so that the chip module 4 is in electrical conduction with the circuit board 3.

When the electrical connection device 100 is electrically connected via the chip module 4 to the circuit board 3, the first contact portion 221a and the second contact portion 221b of the same pin 2 are respectively close along the X-coordinate. However, because the first contact portion 221a and the second contact portion 221b received in the receiving slot 13 of the same pin 2 are disposed along the X-coordinate direction and cross each other respectively at an upper location and a lower location, therefore the first contact portion 221a and the second contact portion 221b are close to each other along the X-coordinate direction but has a safety gap along the Y-coordinate direction when the pin 2 is pressed. Thus, the first contact portion 221a of one of the pins 2 and the second contact portion 221b of another one of the pins 2 that are received in the same receiving slot 13 will not contact each other after both contact portions 221a, 221b are pressed. The pins 2 thus would not be electrically conducted. The required displacement space for the first flexible arm 22a and the second flexile arm 22b of two different pins 2 received in same receiving slot 13 is equal to the required displacement space for one flexible arm (the first flexible arm 22a or the second flexile arm 22b) of the pin 2. Therefore, the dimension of the receiving slot 13 can be reduced, and more quantities of the receiving slots 13 can be located in the insulating body 1 with a certain dimension. This means that more quantities of the pins 2 can be received in the insulating body 1, and so the density of the pins 2 is increased.

The electrical connection device of the present invention has the following characteristics.

The electrical connection device of the present invention locates the base portion of the pin below the first rib board, so at least part of the gap between the first contact portion and the second contact portion is smaller than the narrowest width of the first rib board, thus the pin will not escape from the insulating body. It is convenient for shipping and assembling.

The electrical connection device of the present invention receives the first flexible arm and the second flexible arm of two different pins in the same receiving slot, and the first contact portion of the first flexible arm and the second contact portion of the second flexible arm are respectively crossly located at the upper location and the lower location along the X-coordinate direction, the first flexible arm and the second flexible arm received in the same receiving slot are close to each other along the X-coordinate direction and has a gap along the Y-coordinate direction, so that the two do not interfere with each other when the pins are pressed. The required space for receiving the two flexible arms of two different pins is equal to the required space for one flexible arm (the first flexible arm or the second flexile arm) of one pin. Thereby, by using the pin structure and the aforementioned disposition, more receiving slots can be formed due to the less space that is required, therefore more pins can be located on the insulating body with a certain dimension. When the pin is pressed by the solder ball of the electronic element, each of the first contact portions and each of the second contact portions respectively depart form the center of the solder ball along the X-coordinate direction and the Y-coordinate direction. The contact portions would not contact with each other, so that the pins of the electrical connection device will not have the problem of accidental shorting.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An electrical connection device, used for electrically connecting an electronic element with solder balls, comprising:

an insulating body, wherein the insulating body has a plurality of receiving slots arranged in columns and rows, and a plurality of first rib boards are formed between adjacent receiving slots along each of the rows and a plurality of second rib boards are formed between adjacent receiving slots along each of the columns, and the first rib boards extend to define a Y-coordinate direction, and the second rib boards extend to define a X-coordinate direction; and a plurality of pins, wherein each of the pins has a base portion located below the first rib board, a first flexible arm and a second flexible arm are extended upwardly from the base portion, and the end of the first flexible arm and the end of the second flexible arm respectively form a first contact portion and a second contact portion which are slanted and opposite to each other, and respectively pressed by one of opposite side and not aligned sides of the solder ball, and, the first contact portion and the second contact portion of each contact enter into slots which have a first receiving slot and the adjacent receiving slot respectively; and wherein each of the receiving slots receives the first flexible arm of one pin and the second flexible arm of adjacent pin, and thus the first contact portion and the second contact portion in the same receiving slot are also misaligned along the X-coordinate direction;

wherein when the solder ball contacts with the first contact portion and the second contact portion of the same pin, the solder ball presses the first contact portion and the second contact portion and thus the first contact portion and the second contact portion depart from each other along both the X-coordinate direction and the Y-coordinate direction, and the first contact portion of the one of the pins and the second contact portion of an adjacent pin approach each other along the X-coordinate direction and depart from each other along Y-coordinate direction;

wherein the first contact portion and the second contact portion of each contact are respectively higher than the first rib board; and wherein the first rib having an opening for receiving the base portion therein and the first rib is in between the first and second flexible arms.

2. The electrical connection device as claimed in claim 1, wherein an electric conducting portion is formed downwards from the base portion.

3. The electrical connection device as claimed in claim 2, wherein the first contact portion and the second contact portion both are slanted contact surfaces that generate a downward force to the pins so that the electric conducting portion contacts a conducting area of a circuit board.

4. The electrical connection device as claimed in claim 1, wherein the first contact portion and the second contact portion are respectively higher than the second rib board.

5. The electrical connection device as claimed in claim 1, wherein the projection shadow of one of the solder balls is located above the first rib board and two receiving slots which are adjacent to both sides of the rib board.

6. The electrical connection device as claimed in claim 1, wherein before the solder ball is pressed, at least part of the gap between the first contact portion and the second contact portion is narrower than the width of the first rib board.

7. An electrical connection device, used for electrically connecting an electronic element with solder balls, comprising:

an insulating body, wherein the insulating body has a plurality of receiving slots arranged in columns and rows, and a plurality of first rib boards are formed between adjacent receiving slots along each of the rows and a plurality of second rib boards are formed between adjacent receiving slots along each of the columns, and the first rib boards extend to define a Y-coordinate direction, and the second rib boards extend to define a X-coordinate direction; and a plurality of pins, wherein each pin has a base portion located below the first rib board, a first flexible arm and a second flexible arm are extended upwardly from the base portion, and the end of the first flexible arm and the end of the second flexible arm respectively form a first contact portion and a second contact portion, which are slanted and opposite to each other, and respectively pressed by one of opposite side and not aligned sides of the solder balk and the first contact portion and the second contact portion of each contact enter into slots which have a first receiving slot and the adjacent receiving slot respectively; and wherein each of the receiving slots receives the first flexible arm of one pin and the second flexible arm of adjacent pin, and thus the first contact portion and the second contact portion in the same receiving slot are also misaligned along the X-coordinate direction;

wherein when the solder ball contacts with the first contact portion and the second contact portion of the pin, the solder ball presses the first contact portion and the second contact portion and thus the first contact portion and the second contact portion depart from each other along both the X-coordinate direction and the Y-coordinate direction, and the first contact portion of the one of the pins and the second contact portion of an adjacent pin approach each other along the X-coordinate direction and depart from each other along Y-coordinate direction; and a circuit board having a plurality of soldering pads that are respectively soldered with the soldering part wherein the first contact portion and the second contact portion of each contact are respectively higher than the first rib board; and wherein the first rib having an opening for receiving the base portion therein and the first rib is in between the first and second flexible arms.

* * * * *